United States Patent [19]

Iversen et al.

[11] Patent Number: 4,799,543
[45] Date of Patent: Jan. 24, 1989

[54] MEANS FOR TEMPERATURE CONTROL OF HEATED SURFACES

[75] Inventors: Arthur H. Iversen, 15315 Sobey Rd., Saratoga, Calif. 95070; Stephen Whitaker, Davis, Calif.

[73] Assignee: Arthur H. Iversen, Saratoga, Calif.

[21] Appl. No.: 119,698

[22] Filed: Nov. 12, 1987

[51] Int. Cl.$^4$ .............................................. F28F 13/00
[52] U.S. Cl. ............................... 165/135; 165/80.4; 165/133; 361/385; 357/82; 313/30
[58] Field of Search ............ 165/133, 135, 146, 80.4; 361/385, 401; 313/30; 357/68, 74, 80, 82

[56] References Cited

U.S. PATENT DOCUMENTS

| | | | |
|---|---|---|---|
| 3,776,305 | 12/1973 | Simmons | 165/80.4 |
| 4,216,826 | 8/1980 | Fujikake | 165/133 |
| 4,381,818 | 5/1983 | Sachar et al. | 165/133 |
| 4,405,876 | 9/1983 | Iverson | 313/30 |
| 4,434,842 | 3/1984 | Gregory | 165/133 |
| 4,455,504 | 6/1984 | Iverson | 313/30 |
| 4,622,687 | 11/1986 | Iverson et al. | 313/30 |
| 4,684,844 | 8/1987 | Iverson | 313/30 |
| 4,712,609 | 12/1987 | Iverson | 165/80.4 |

*Primary Examiner*—James C. Yeung
*Attorney, Agent, or Firm*—Foley & Lardner

[57] ABSTRACT

A method for providing an approximately uniform temperature distribution on a cold plate that has at least one of a non-uniform temperature distribution on its heated surface and non-uniform wall thickness separating the heated surface from the generally opposing fluid cooled surface. Low thermal conductivity material is selectively deposited on the fluid cooled surface of the cold plate such that the resulting local thermal resistivity combined with the corresponding local heat flux results in an approximately constant temperature over the heated surface on the cold plate.

13 Claims, 1 Drawing Sheet

U.S. Patent   Jan. 24, 1989   4,799,543
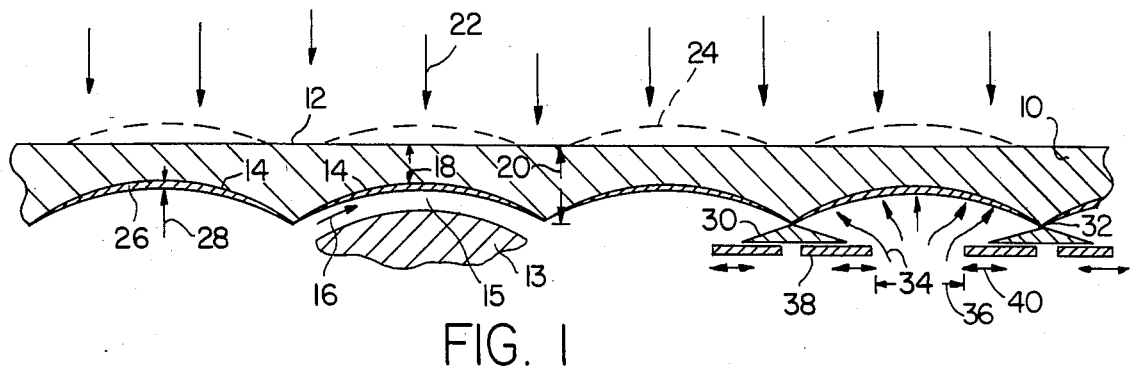
FIG. 1
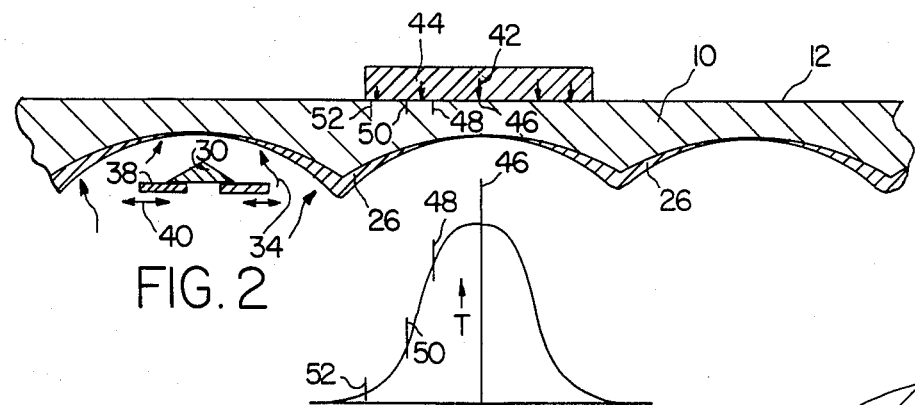
FIG. 2
FIG. 2A
FIG. 4
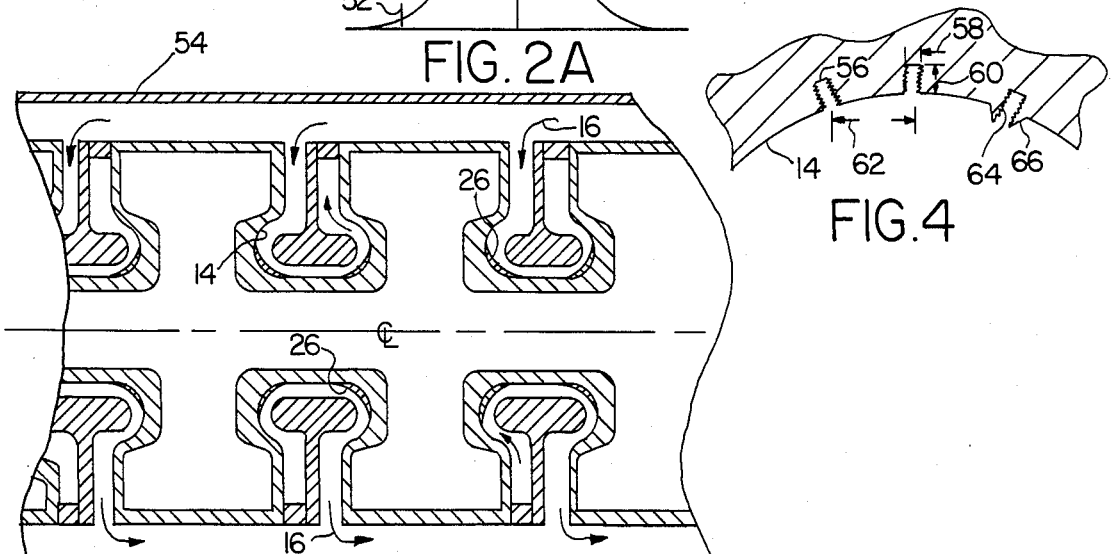
FIG. 3

MEANS FOR TEMPERATURE CONTROL OF HEATED SURFACES

(1) Technical Field

Devices including surfaces comprising a heated surface and a generally opposing liquid cooled surface wherein approximately uniform temperature distribution is maintained on the heated surface under conditions of at least one of a non-uniform heat flux on said heated surface and a non-uniform wall thickness separating said heated surface from said liquid cooled opposing face.

(2) Background

It is often necessary to maintain a heated surface at a uniform temperature in order to avoid undesirable mechanical distortion, e.g. maintain uniform expansion. Examples include space based mirrors for focusing laser beams and cavities in linear accelerators and microwave tubes. Because of the high incident energy on the mirror, a significant portion is converted to heat and must be removed in such manner as not to appreciably effect the focus of the mirror, that is, expansion must be precisely controlled. Further examples are to be found in the RF segments and other anodic (high voltage) segments of microwave tubes such as gyrotrons and in the accelerator section of free electron lasers, X-ray linacs and other positive, negative and neutral particle accelerators. The RF cavities contained in the particle accelerating section of the various devices are designed to be responsive to a particular RF frequency. In high power devices, part of the RF energy present in the cavities to accelerate the particles is dissipated on the cavity surface and raises the temperature of the cavities. Since the energy dissipation is generally non-uniform, non-uniform heating of the cavities can occur which can mechanically distort them by virtue of non-uniform expansion causing less efficient operation of the device. In addition, localized high flux dissipation caused by any interception of the particles on various structural components, e.g. the RF sections of microwave tubes and RF sections of accelerators, further increases the heat dissipation problem.

SUMMARY OF THE INVENTION

The present invention provides means whereby high heat fluxes may be dissipated while maintaining an approximately uniform temperature over the heated surface.

The present invention further provides means whereby the temperature of the liquid cooled heat exchange surface remains at approximately the same temperature from non-operating to maximum power dissipation.

The present invention provides an approximately uniform surface temperature on a uniformly heated surface with a variable wall thickness by altering the thermal resistivity ($R_t \sim d/k$) of said wall, where R is the thermal resistivity, d the wall thickness and k the thermal conductivity of the material from which the wall is made. The altered thermal resistivity of certain parts of the wall thickness is such that an approximately constant temperature drop is produced across of the wall separating the heated surface from its opposing fluid, e.g., liquids, gases, vapors etc., cooled surface. On a non-uniformly heated surface a uniform temperature is obtained by at least one of varying the wall thickness and altering the thermal resistivity of the wall separating the heated surface from its opposing fluid cooled surface such that an approximately constant temperature drop is produced across said wall thickness.

The present invention provides an approximately constant temperature liquid cooled surface when ranging from no heat input to maximum heat input on the heated surface opposing the liquid cooled surface by injecting liquid coolant at approximately the boiling temperature of said coolant and during boiling heat transfer utilizing the heat of vaporization of the coolant to effect the desired heat transfer. The foregoing i useful where it is important to maintain approximately constant dimensions of a structure over the range of no heat dissipation to maximum heat dissipation.

The foregoing may be accomplished over a broad range of heat fluxes imposed on the heated surface of said cold plate, and is especially advantageous at high heat fluxes. The methods to be described may be applied to heat transfer surfaces in general. As a preferred embodiment, the following description addresses application to curved heat transfer surfaces which are especially useful in high heat flux environments.

DESCRIPTION OF THE DRAWINGS

FIG. 1 is a cross-sectional view of a cold plate or heat sink with a non-uniform wall thickness with temperature equalizing material selectively added to the liquid cooled side of the cold plate.

FIG. 2 is a cross-sectional view of a cold plate or heat sink with a non-uniform wall thickness and non-uniform heat source mounted on the heated surface of the cold plate and, temperature equalizing material selectively added to the fluid cooled side of the cold plate.

FIG. 2A is a plot of the temperature along the heated surface of the cold plate due to the operation of a semiconductor.

FIG. 3 is the cross-section of the RF cavities of a particle accelerator, e.g. electron, ion, etc., showing liquid cooling of the cavities.

FIG. 4 shows a curved liquid cooled heat exchange surface prepared with cavities for optimum nucleate boiling.

DETAILED DESCRIPTION OF THE PREFERRED EXEMPLARY EMBODIMENT

For the purposes of the present invention and as used in the specification and claims, a cold plate is a heat transfer structure or component of a structure, such as a heat sink, that has one surface heated by a source of heat and a generally opposing surface that is cooled by a fluid. The source of heat may be, but is not limited to, energy beams, such as negative, e.g. electrons, positive, e.g. ions or neutral particles; electromagnetic waves, e.g., RF or conductive heat sources such as semiconductors or resistors.

Referring now to FIG. 1, shown is cold plate 10 comprising heated surface 12 and opposing multiple curved liquid cooled surfaces 14. Septum 13 and curved surface 14 define conduit 15 for the flow 16 of liquid coolant. Curved surfaces 14 cause a centrifugal force to be generated by the flow 16 of liquid coolant over said curved surface 14. The centrifugal force acting on boiling coolant 16 flowing over the convex curved surface 14 causes the nucleate bubbles to rapidly depart, in a approximately normal direction, from curved heat exchange surface 14. The radial bubble velocity is approximately proportional to the square root of the centrifugal force. For example, at a 1" radius of curvature for surface 14 and 52 ft/sec coolant velocity, an approximately 1000 g force is established. Thus, the bubble velocity is about 30× greater than at 1 gravity (1 "gee"). Not only is a higher heat flux achieved, but early film boiling with potential destruction of the structure, as would occur in linear flow used in conventional systems, is avoided.

Linear flow heat transfer is strongly dependent upon sub-cooling, i.e. the temperature difference between the boiling point and the liquid bulk temperature. When a constant temperature is required in a structure utilizing linear flow the coolant enters at approximately the boiling temperature, thus the sub-cooling will be negligible with consequent very poor heat transfer which can lead to early film boiling. This is caused by the coalescence of the nucleate bubbles to form a vapor blanket over the heat transfer surface. With the centrifugal force at curved surface 14, the bubbles are driven approximately normally away from the boiling surface thereby enabling efficient heat transfer over a range of heat flux, extending into the high heat flux region. The foregoing applies to all versions of curved surface cooling, including those described herein which incorporate deposited material 26 to selectively control the temperature of heated surface 12. In a gas or vapor cooled structure, curved heat exchange surfaces offer little advantage, and therefore, linear surfaces would be used.

Periodic curved surface 14 geometry results in variable wall thickness ranging from 18 to 20. Assuming that the liquid coolant is removing heat by nucleate boiling, the temperature of curved surface 14 becomes that of the coolants boiling temperature, e.g. 100° C. for water at 1 atmosphere Also assuming that the heat flux 22 incident on heated surface 12 is approximately uniform, there will arise a temperature variation along the heated surface 12 that is directly proportional to the wall thickness of the cold plate 10 as it varies from thickness 18 to thickness 20. However, lateral heat transfer will modify this to some extent. This temperature variation is proportional to incident heat flux 22 and wall thickness ranging from 18 to 20 and, inversely proportional to the thermal conductivity of the material, e.g. metal, from which the cold plate 10 is made. Inasmuch as the heated surface 12 will expand in direct response to a temperature rise, there will be an uneven expansion of heated surface 12 corresponding to the variation in wall thickness from 18 to 20 and, each adjoining curved surface 14 will repeat the temperature variation. Since the material expands in response to the temperature rise, a variable temperature results in a corresponding variable expansion of surface 12. This uneven expansion can result in surface 12 having a "ripple" 24 geometry (FIG. 1). The foregoing applies, in general, to all heated surfaces separated by a variable wall thickness from a generally opposing cooled surface. The most common application is to metal structure, but it may also be applied to other materials such as ceramics In applications where precise dimensional tolerances must be maintained, such as in space based laser mirrors, the accelerator section of particle accelerators and, the RF interaction structures of microwave tubes, e.g. gyrotron cavities, such uneven expansion can have deleterious effects on device performance such as defocusing of mirrors and detuning of cavities.

To achieve a constant temperature across the wall of cold plate 10, a lower thermal conductivity material 26 than that of cold plate 10 is selectively deposited on curved surface 14 in such manner that it is thicker 28 at minimum wall thickness 18 decreasing to approximately zero thickness at maximum wall thickness 20. Thickness 28 is such that the temperature drop across thickness 28 is equal to the difference between the temperature drop at wall thickness 20 and that at wall thickness 18. All intermediate points on curved surface 14 will have deposited thickness of material 26 that will range from approximately zero at point 20 to 28 at point 18 thereby balancing out the variation in wall thickness from 20 to 18. The thickness of deposited material 26 is proportional to the thermal conductivity of material 26 the lower the thermal conductivity, the less material required For example, if cold plate 10 is made of copper whose thermal conductivity is 225 BTU/hr ft F and deposited material 26 is nickel whose thermal conductivity is 35 BTU/hr ft° F, there is a 6.4 to 1 difference in thermal conductivity. When the deposited material 26, e.g. nickel, is caused to alloy with the cold plate 10, e.g copper, a copper-nickel alloy results whose thermal conductivity is even lower than that of pure nickel. For example, Cupronickel 30% has a thermal conductivity of 17 BTU/hr ft F and that for Cupronickel 55-45 is 13 BTU/hr ft F, thermal conductivity ratios of 13:1 and 17:1 when compared to copper. Alloying of the metals is achieved by precise control of time and temperature in a controlled atmosphere furnace or vacuum furnace.

Material 26 may be deposited on curved surface 14 by a number of means such as, electroplating, evaporation, CvD, sputtering, flame spray, spraying, painting etc. Low thermal conductivity alloys such as Hastalloy C (5 BTU/hr ft F) may be used as material 26. Means 30 are placed in the proximity of curved surfaces 14 to permit a coating of variable thickness of material 26 to be deposited. FIG. 1 depicts an electroplating process for depositing material 26 where arrows 34 show the direction of material 26 deposition. With aperture 36, point 28 on curved surface 14 receives the highest rate of material 26 deposition. Point 32 being shielded by mask 30 receives virtually no material. All other points on curved surface 14 receive intermediate amounts of material 26 depending upon the geometry of mask 30. Further control over the deposition process may be achieved by adding movable elements 38 to fixed mask 30 which travel 40 to provide a time variable masking action of the surface being coated. Alternatively or in addition to the foregoing, varying the geometry of the masks elements 30 and 38 in the region of the curved surfaces 14, e.g., an expanding and contracting elastomer mask, can provide further control over the coating process. The geometry of mask elements 30 and 38 may be optimized to provide the desired distribution of material 26 on curved surface 14.

The thickness of deposited material 26 required for a given structure may be best illustrated by an example. Assume that cold plate 10 is made of copper whose thermal conductivity is 225 BTU/hr ft ° F. and that the wall thickness difference between 20 and 18 is 1 mm (0.040"). To maintain a constant cold plate surface temperature on the heated surface 12, the thermal resistance (d/k) where d is the thickness and k the thermal conductivity, of material 26 starting at point 18 must be equal to that of 1 mm (0.040") of copper, that is, it must compensate for the extra wall thickness (1 mm) of copper at 20, with intermediate points having progressively less material 26; there being essentially zero material 26 at 20. The sum $R_t$ of the thermal resistance of material 26 $d_2/k_2$ and cold plate wall $d_1/k_1$, e.g. 18, is approximately constant $R_t=d/k=d_1/k_1+d_2/k_2$ where $d_1$ is the local thickness of the cold plate wall and k is the thermal conductivity of the cold plate, and $d_2$ is the local thickness of the added low thermal conductivity material and $k_2$ is its thermal conductivity. Assuming that a cupronickel 55-45 is used, its thermal conductivity of 13 BTU/hr ft F is 1/17 of copper, or about 6%. Thus, the cupronickel 55-45 need only be 6% of 1 mm (0.040"), or 0.06 mm (0.0024") thick at 28, to have the same thermal resistance as 1 mm of copper. If Hastalloy C, 5 BTU/hr ft ° F. were used, a thickness of 0.02 mm (0.0008") is required. Because added material 26 is so thin, the geometry of curved surface 14 and therefore, the heat removal characteristics, is minimally affected. The thickness of material 26 in varying from 28 to 32, becoming approximately zero at 32, decreases in such a manner that an approximately constant thermal wall resistivity is present throughout cold plate 10. With repetitive liquid cooled surfaces 14 as shown, the pattern of deposited material 26 is also repetitive. The foregoing, in general, describes a device where the heat flux 22 on heated surface 12 of cold plate 10 is approximately uniform.

In examining a structure, FIG. 2, where the incident heat flux 42 on heated surface 12 of cold plate 10 is non-uniform, a semiconductor device 44 may serve as a good example. FIG. 2A shows a graph of the temperature profile of heated cold plate surface 12 at points 46, 48 50 and 52 resulting from the operation of semiconductor device 44 Because of the rapid fall off in temperature in going from points 46 to 52, (46 will be hotter than 52) there will be a non-uniform expansion and a resultant "doming" 12 (as shown in FIG. 1) at 46. Cycling could eventually cause fatigue cracking of hard solder joints.

To create a uniform temperature between 46 and 52, low thermal conductivity material 26 is deposited as before, but with a different distribution, to increase the thermal resistance from 46 to 52 in a controlled manner so that the increasingly higher thermal resistance from 46 to 52 compensates for the decreasing temperature profile, i.e. decreasing heat flux, which results in an approximately uniform surface temperature on heated surface 12. In this example, the fall off in heat flux in going from point 46 to point 52 is more rapid than the increase in thermal resistivity caused by the increasing wall thickness of cold plate 10 when going from point 46 to point 52. Since the temperature drop $\Delta t$ across the plate is proportional to the product of the heat flux (q) times the thermal resistance (d/k), i.e., $\Delta t \sim qd/k$, where d is the wall thickness of 10, and k is the thermal conductivity of the cold plate; the decrease in heat flux can be compensated for by an increase in thermal resistance (d/k). In the axis parallel to curved surfaces 14, i.e., the axis orthogonal to the views in FIGS. 1 and 2, the distribution of low thermal conductivity material 26 would follow the same prescription to provide an approximately uniform temperature of the cold plate surface. It should be noted that lateral heat transfer considerations will further modify the thickness and distribution of low thermal conductivity material 26.

In FIG. 2, the heated surface 12 reaches the temperature corresponding to 46, the maximum temperature point. This uniform temperature at the semiconductor-cold plate interface minimizes the expansion, e.g., "doming" 24 of FIG. 1, that will normally occur thereby enabling the use of superior hard braze materials, e.g. improved strength, thermal conductivity, etc. and minimizes thermal fatigue problems due to cycling and life. It may be desirable to provide auxiliary heating sources on cold plate surface 12 that are adjacent semiconductor 44 to provide a larger heated surface adjacent semiconductor 44 thereby further minimizing any distortion in the region of semiconductor 44. In general, for semiconducting devices, desirable cold plate materials include molybdenum and tungsten and, ceramics such as silicon nitride, beryllia, aluminum nitride and silicon carbide, that have high thermal conductivity and coefficients of expansion that satisfactorily match silicon.

To deposit low thermal conductivity material 26 on ceramic cooled surface 14, surface 14 may be first selectively metalized with, for example, the well-known moly-manganese method and then material, e.,g. metals, 26 selectively deposited as described before. To selectively depost said metalization on said ceramic surface 14, the well-known photo-resist method as extensively used by the semiconductor industry may be employed. Alternately, low thermal conductivity material 26 may be ceramic, such as aluminum oxide, and selectively deposited by spraying, painting, sputtering or other appropriate technique. FIG. 3 illustrates RF structures 54, e.g. cavities, slow wave structure, etc. as might be used in linear accelerator sections of negative, positive and neutral beam particle accelerators; microwave tubes such as gyrotrons, klystrons, TWT's magnetrons, etc. Shown are curved liquid cooling surfaces 14 positioned within RF structures 54. Deposited material 26 is selectively deposited on the liquid cooled side of those surfaces of the RF structure that dissipate less RF energy than the balance of the RF structure. In this manner, as previously described, the higher thermal resistivity combined with the lower heat flux results in a approximately uniform temperature of the RF conducting surface of the RF structure.

In addition to deposited material 26, the wall thickness, i.e. between the heated surface and the liquid cooled surface may be varied, for example, by varying the radius of curvature surface 14 to alter the thermal resistivity. This may be applied to all prior examples and discussions relating to FIGS. 1 to 4.

A further means whereby the temperature of the foregoing structures may be more precisely controlled thereby minimizing mechanical expansion from the power off condition to the full power on condition is to introduce the liquid coolant into the structures described in FIGS. 1 to 4 at approximately the boiling temperature of the liquid. Referring again to FIG. 1, liquid coolant, such as freon 113 which boils at 47° C., is introduced at, for example, 46° C. Thus, with no heat flux incident on surface 12, the entire structure in FIGS. 1, 2, and 3, will reach equilibrium at approximately 46° C. in the "off" condition. As the structures of FIGS. 1, 2, and 3 are powered up, i.e. the heat flux on surface 12, starting from zero, starts to increase, curved liquid cooled surface 14 will rapidly commence nucleate boiling thus increasing to 47° C. As the heat flux increases, nucleate boiling becomes progressively more vigorous. However, the temperature of the liquid cooled heat transfer surface 14 remains very close to 47° C., an increase of 1° C. Any small variations in the temperature over the heated surface are predominately caused by the degree of super heat present at the liquid cooled surface. This super heat is of the order of several degrees for large variations in the heat flux with efficient nucleate boiling.

Referring now to FIG. 4, heat exchange at the liquid cooled heat exchange surface 14 is further enhanced by the preparation of nucleating site cavities 56 on the heat exchange surface 14 that are of optimum dimensions 58, 60 and spacing 62 on the heat exchange surface such that maximum heat flux removal is achieved without encountering the destructive condition of film boiling. Cavity dimensions 58, 60 may range from 0.002 mm to 0.2 mm and spacing between cavities 62 on the heat exchange surface may range from 0.03 mm to 3 mm. This specified geometry of nucleating cavity dimensions and spacing between cavities may be achieved chemically, e.g., by chemical milling, electronically, e.g., lasers or electron beam, mechanically, e.g., drilling, hobbing, etc. The inside surfaces of the cavities serving as nucleating sites are further prepared with micro cavities 64, preferably re-entrant, with dimensions generally in the range of $10^{-2}$ to $10^{-4}$ mm. Micro cavities serve as long-lived vapor traps that remain in equilibrium with the liquids and serve as the initial nucleate boiling sites until the larger cavities commence nucleate boiling. Micro cavities may be created by judicious selection of diamond, or other cutting material, particle size which is embedded in the drill bit. With the laser, materials such as reactive vapors or gases may be introduced which react with the anode material to create the desired pitting effect. A further desirable geometry is a truncated cone 66 containing cavity 56, cavity 56 being exposed to the liquid coolant. In addition, the outer surface of the truncated cone may also possess micro cavities due to the laser melting of material and subsequent deposition action at the edge of the cavity. In general, cavities 56 are prepared after material 26 is deposited so as not to cover or destruct cavities 56.

Heat transfer may be further enhanced by breaking up the viscous sublayer present next to liquid cooled surface 14 by providing roughness height on the heat transfer surface 14 that ranges from about 0.3 thickness of the viscous sublayer to several times the height of the combined thickness of the viscous sublayer and transition zone, the aforementioned truncated cone 66 being a desirable geometry for said roughness. The height of the truncated cone 66, i.e. roughness, may vary over the range of 0.0001" to 0.008".

It is also to be understood that the foregoing method of selectively applying low thermal conductivity material to the heat exchange surface of a cold plate may also be applied to fluids other than liquids, such as gases or vapors. In gas or vapor cooled cold plates, lateral heat transfer can become significantly more important and must be accounted for when depositing low thermal conductivity material. In vapor or gas cooled cold plates, curved heat exchange surfaces offer no advantage. Conventional heat exchange geometries are adequate.

It will be understood that the above description is of preferred exemplary embodiments of the present invention and that the invention is not limited to the specific forms shown. Modifications may be made in the design and arrangement of the elements without departing from the spirit of the invention as expressed in the appended claims

I claim:

1. A heat sink structure including a heated surface and further including a heat exchange surface on the interior surface thereof, said structure providing means for enclosing said heat exchange surface in a fluid tight manner and including means for providing a flow of fluid to remove heat from said heat exchange surface, said heat sink structure having at least one of a variable wall thickness separating said heated surface from said fluid cooled surface and a variable distribution of heat flux on said heated surface, the improvement wherein said fluid cooled heat exchange surface includes:

means, disposed on said fluid cooled heat exchange surface in a variable manner commensurate with said variable wall thickness and said variable distribution of heat flux such that an approximately uniform temperature is achieved over said heated surface 2. In the apparatus of claim 1 the further improvement wherein said means comprises material of lower thermal conductivity than that of said heat sink structure.

3. In the apparatus of claim 2 the further improvement wherein said material of lower thermal conductivity is deposited in variable thickness on said fluid cooled heat exchange surface in such manner as to be responsive to said variations in said wall thickness and heat flux such that an approximately uniform surface temperature is achieved on said heated surface 4. A heat sink structure including a heated surface and including a heat exchange surface on the interior surface thereof, said structure providing means for enclosing said heat exchange surface in a liquid tight manner and including means for providing a flow of coolant liquid to remove heat from said heat exchange surface by nucleate boiling, said heat sink structure having at least one of a variable wall thickness separating said heated surface from said liquid cooled surface and a variable distribution of heat flux on said heated surface, said liquid cooled heated surface further includes:

means, disposed on said heat exchange surface for forming pressure gradients in said liquid having a component perpendicular to said heat exchange surface without substantially impeding the relative velocity between said heat exchange surface and said Liquid, said component having a magnitude directly proportional to the square of the relative velocity between said heat exchange surface and said liquid, to facilitate removal of nucleate bubbles, the improvement wherein said liquid cooled heat exchange surface includes:

means, disposed on said liquid cooled heat exchange surface in a variable manner commensurate with said variable wall thickness and said variable distribution of heat flux such that an approximately uniform temperature is achieved over said heated surface.

5. In the apparatus of claim 4 the further improvement wherein said means comprises material of lower thermal conductivity than that of said heat sink structure.

6. In the apparatus of claim 5 the further improvement wherein said material of lower thermal conductivity is deposited in variable thickness on said liquid cooled heat exchange surface in such manner as to be responsive to said variations in said wall thickness and heat flux such that an approximately uniform surface temperature is achieved on said heated surface.

7. In the apparatus of claim 6 the further improvement wherein the interior surface of said heat sink structure contains one or more adjacent periodic curves across substantially the width of said structure and extending substantially the length of said structure and wherein a liquid coolant diverter is structured in close proximity to said heat exchange surface to provide predetermined liquid flow conditions at said anode heat exchange surface.

8. In the apparatus of claim 7 the further improvement wherein each said period or curve is provided with ducting for the alternate injection and removal of said liquid coolant.

9. In the apparatus of claim 8 the further improvement wherein said heat exchange surface is prepared with means disposed on said heat exchange surface for forming nucleate bubbles of predetermined size and distribution to thereby increase heat flux.

10. In the apparatus of claim 9 the further improvement wherein said means comprises cavities and said cavities have dimensions in the range of 0.002 mm to 0.2 mm, and said cavities being spaced apart on said heat exchange surface a distance ranging from 0.03 mm to 3 mm whereby more efficient heat transfer is obtained.

11. In the apparatus of claim 10 the further improvement wherein said heat exchange surface is further prepared with roughness said roughness having heights ranging from 0.0001" to 0.008" above said heat exchange surface whereby the viscous sublayer may be broken up.

12. In the apparatus of claim 10 the further improvement whereby the inside surface of said cavities are prepared with micro cavities the dimensions of said micro cavities being in the range of $1 \times 10^{-2}$ mm to $1 \times 10^{-4}$ mm.

13. In the apparatus of claim 4 the further improvement wherein said liquid coolant is introduced at approximately its boiling point.

* * * * *